United States Patent [19]

Lange

[11] Patent Number: 5,654,907

[45] Date of Patent: *Aug. 5, 1997

[54] METHOD FOR FAST KALMAN FILTERING IN LARGE DYNAMIC SYSTEM

[76] Inventor: Antti Aarne Lange, Liisankatu 15 A 10, Helsinki 17, Finland, 00170

[*] Notice: The term of this patent shall not extend beyond the expiration date of Pat. No. 5,506,794.

[21] Appl. No.: 325,291

[22] PCT Filed: May 5, 1993

[86] PCT No.: PCT/FI93/00192

§ 371 Date: Nov. 1, 1994

§ 102(e) Date: Nov. 1, 1994

[87] PCT Pub. No.: WO93/22625

PCT Pub. Date: Nov. 11, 1993

[30] Foreign Application Priority Data

May 5, 1992 [FI] Finland ................................. 922031

[51] Int. Cl.⁶ .................................................. G06F 19/00
[52] U.S. Cl. ........................... 364/571.04; 364/571.01
[58] Field of Search ...................... 364/724.01, 571.01, 364/571.04

[56] References Cited

U.S. PATENT DOCUMENTS 5,506,794  4/1996  Lange ..................... 364/571.01

*Primary Examiner*—Edward R. Cosimano
*Assistant Examiner*—Demetra R. Smith

[57] ABSTRACT

The invention is based on the use of the principles of Lange's Fast Kalman Filtering (FKF™) for large process control, prediction or warning systems where other computing methods are either too slow or fail because of truncation errors. The invented method makes it possible to exploit the FKF method for dynamic multiparameter systems that are governed by partial differential equations.

1 Claim, 1 Drawing Sheet

METHOD FOR FAST KALMAN FILTERING IN LARGE DYNAMIC SYSTEM

TECHNICAL FIELD

This invention relates generally to all practical applications of the Kalman Filter and more particularly to large dynamical systems with a special need for fast, computationally stable and accurate results.

BACKGROUND ART

Prior to explaining the invention, it will be helpful to first understand the prior art of both the Kalman Filter (KF) and the Fast Kalman Filter (FKF™) for calibrating a sensor system (WO 90/13794). The underlying Markov process is described by the equations from (1) to (3). The first equation tells how a measurement vector $y_t$ depends on the state vector $s_t$ at timepoint t, (t=0,1,2 ... ). This is the linearized Measurement (or observation) equation:

$$y_t = H_t s_t + e_t \quad (1)$$

The design matrix $H_t$ is typically composed of the partial derivatives of the actual Measurement equations. The second equation describes the time evolution of e.g. a weather balloon flight and is the System (or state) equation:

$$s_t = s_{t-1} + u_{t-1} + a_t \quad (2)$$

(or, $s_t = A s_{t-1} + B u_{t-1} + a_t$ more generally) which tells how the balloon position is composed of its previous position $s_{t-1}$ as well as of increments $u_{t-1}$ and $a_t$. These increments are typically caused by a known uniform motion and an unknown random acceleration, respectively.

The measurement errors, the acceleration term and the previous position usually are mutually uncorrelated and are briefly described here by the following covariance matrices:

$$R_{e_t} = Cov(e_t) = E(e_t e_t')$$

$$R_{a_t} = Cov(a_t) = E(a_t a_t')$$

and $$P_{t-1} = Cov(\hat{s}_{t-1}) = E\{(\hat{s}_{t-1} - s_{t-1})(\hat{s}_{t-1} - s_{t-1})'\} \quad (3)$$

The Kalman forward recursion formulae give us the best linear unbiased estimates of the present state $$\hat{s}_t = \hat{s}_{t-1} + u_{t-1} + K_t\{y_t - H_t(\hat{s}_{t-1} + u_{t-1})\} \quad (4)$$

and its covariance matrix $$P_t = Cov(\hat{s}_t) = P_{t-1} - K_t H_t' P_{t-1} \quad (5)$$

where the Kalman gain matrix $K_t$ is defined by $$K_t = (P_{t-1} + R_{a_t}) H_t' \{H_t(P_{t-1} R_{a_t}) H_t' + R_{e_t}\}^{-1} \quad (6)$$

Let us now partition the estimated state vector $\hat{s}_t$ and its covariance matrix $P_t$ as follows:

$$\hat{s}_t = \begin{bmatrix} \hat{b}_t \\ \hat{c}_t \end{bmatrix}, P_t = Cov(\hat{s}_t) = \begin{bmatrix} P_{b_t} & Cov(\hat{b}_t, \hat{c}_t) \\ Cov(\hat{c}_t, \hat{b}_t) & P_{c_t} \end{bmatrix} \quad (7)$$

where
$\hat{b}_t$ tells us the estimated balloon position; and,
$\hat{c}_t$ the estimated calibration parameters.
The respective partitioning of the other quantities will then be as follows:

$$H_t = [H_{b_t}, H_{c_t}] = [X_t, G_t], u_t = \begin{bmatrix} u_{b_t} \\ u_{c_t} \end{bmatrix}, a_t = \begin{bmatrix} a_{b_t} \\ a_{c_t} \end{bmatrix}, \quad (8)$$

and, $$R_{a_t} = \begin{bmatrix} R_{a_{b_t}} & Cov(a_{b_t}, a_{c_t}) \\ Cov(a_{c_t}, a_{b_t}) & R_{a_{c_t}} \end{bmatrix}$$

The recursion formulae from (4) to (6) gives us now a filtered (based on updated calibration parameters) position vector $$\hat{b}_t = \hat{b}_{t-1} + u_{b_{t-1}} + K_{b_t}\{y_t - H_t(\hat{s}_{t-1} + u_{t-1})\} \quad (9)$$

and the updated calibration parameter vector $$\hat{c}_t = \hat{c}_{t-1} + u_{c_{t-1}} + K_{c_t}\{y_t - H_t(\hat{s}_{t-1} + u_{t-1})\} \quad (10)$$

The Kalman gain matrices are respectively $$K_{b_t} = (P_{b_{t-1}} + R_{a_{b_t}}) H_{b_t}' \{H_t(P_{t-1} + R_{a_t}) H_t' + R_{e_t}\}^{-1} + \ldots \quad (11)$$

and $$K_{c_t} = (P_{c_{t-1}} + R_{a_{c_t}}) H_{c_t}' \{H_t(P_{t-1} + R_{a_t}) H_t' + R_{e_t}\}^{-1} + \ldots$$

The following modified form of the general State equation is introduced $$A\hat{s}_{t-1} + Bu_{t-1} = I s_t + A(\hat{s}_{t-1} - s_{t-1}) - a_t \quad (12)$$

where $\hat{s}$ represents an estimated value of a state vector s. Combine it with the Measurement equation (1) in order to obtain so-called Augmented Model:

$$\begin{bmatrix} y_t \\ A\hat{s}_{t-1} + Bu_{t-1} \end{bmatrix} = \begin{bmatrix} H_t \\ I \end{bmatrix} s_t + \begin{bmatrix} e_t \\ A(\hat{s}_{t-1} - s_{t-1}) - a_t \end{bmatrix} \quad (13)$$

i.e. $z_t = Z_t s_t + \epsilon_t$

The state parameters can now be computed by using the well-known solution of a Regression Analysis problem given below. Use it for Updating:

$$\hat{s}_t = (Z_t' V_t^{-1} Z_t)^{-1} Z_t' V_t^{-1} z_t \quad (14)$$

The result is algebraically equivalent to use of the Kalman Recursions but not numerically. For the balloon tracking problem with a large number sensors with slipping calibration the matrix to be inverted in equations (6) or (11) is larger than that in formula (14).

The initialization of the large Fast Kalman Filter (FKF™) for solving the calibration problem of the balloon tracking sensors is done by Lange's High-pass Filter. It exploits an analytical sparse-matrix inversion formula (Lange, 1988a) for solving regression models with the following so-called Canonical Block-angular matrix structure:

$$\begin{bmatrix} y_1 \\ y_2 \\ \cdot \\ \cdot \\ \cdot \\ y_K \end{bmatrix} = \begin{bmatrix} X_1 & & & & G_1 \\ & X_2 & & & G_2 \\ & & \cdot & & \cdot \\ & & & \cdot & \cdot \\ & & & & \cdot \\ & & & & X_K & G_K \end{bmatrix} \begin{bmatrix} b_1 \\ \cdot \\ \cdot \\ \cdot \\ b_K \\ c \end{bmatrix} + \begin{bmatrix} e_1 \\ e_2 \\ \cdot \\ \cdot \\ \cdot \\ e_K \end{bmatrix} \quad (15)$$

This is a matrix representation of the Measurement equation of an entire windfinding intercomparison experiment or one balloon flight. The vectors $b_1, b_2, \ldots, b_K$ typically refer to consecutive position coordinates of a weather balloon but may also contain those calibration parameters that have a significant time or space variation. The vector c refers to the other calibration parameters that are constant over the sampling period.

The Regression Analytical approach of the Fast Kalman Filtering (FKF™) for updating the state parameters including the calibration drifts in particular, is based on the same block-angular matrix structure as in equation (15). The optimal estimates (^) of $b_1, b_2, \ldots b_K$ and c are obtained by making the following logical insertions into formula (15) for each timepoint t, t=1,2, ... :

$$y_k := \begin{bmatrix} y_{t,k} \\ \hat{b}_{t-1,k} + u_{b_{t-1,k}} \end{bmatrix}; X_k := \begin{bmatrix} X_{t,k} \\ -I- \end{bmatrix}; \quad (16)$$

$$G_k := \begin{bmatrix} G_{t,k} \\ ---- \end{bmatrix}; b_k := b_{t,k}; \text{ and,}$$

$$e_k := \begin{bmatrix} e_{t,k} \\ (\hat{b}_{t-1,k} - b_{t-1,k}) - a_{b_{t,k}} \end{bmatrix}; \text{ for } k = 1, \ldots, K;$$

and, $$y_{K+1} := \hat{c}_{t-1} + u_{c_{t-1}}; X_{K+1} := [\text{empty}];$$

$$G_{K+1} := [I]; c := c_t; \text{ and, } e_{K+1} := (\hat{c}_{t-1} - c_{t-1}) - a_{c_t}$$

These insertions concluded the specification of the Fast Kalman Filter (FKF™) algorithm for calibrating the upper-air wind tracking system. Another application would be the Global Observing System of the World Weather Watch. Here, the vector $y_k$ contains various observed inconsistencies and systematic errors of weather reports (e.g. mean day-night differences of pressure values which should be about zero) from a radiosonde system k or from a homogeneous cluster k of radiosonde stations of a country (Lange, 1988a/b). The calibration drift vector $b_k$ will then tell us what is wrong and to what extent. The calibration drift vector c refers to errors of a global nature or which are more or less common to all observing systems (e.g. biases in satellite radiances and in their vertical weighting functions or some atmospheric tide effects).

For all these large multiple sensor systems their design matrices H typically are sparse. Thus, one can usually perform in one way or another the following sort of Partitioning: (17)

$$s_t = \begin{bmatrix} b_{t,1} \\ \cdot \\ \cdot \\ \cdot \\ b_{t,K} \\ c_t \end{bmatrix} \quad y_t = \begin{bmatrix} y_{t,1} \\ y_{t,2} \\ \cdot \\ \cdot \\ y_{t,K} \end{bmatrix} \quad H_t = \begin{bmatrix} X_{t,1} & & & & G_{t,1} \\ & X_{t,2} & & & G_{t,2} \\ & & \cdot & & \cdot \\ & & & \cdot & \cdot \\ & & & X_{t,K} & G_{t,K} \end{bmatrix}$$

$$A = \begin{bmatrix} A_1 & & & \\ & \cdot & & \\ & & A_K & \\ & & & A_c \end{bmatrix} \text{ and, } B = \begin{bmatrix} B_1 & & & \\ & \cdot & & \\ & & B_K & \\ & & & B_c \end{bmatrix}$$

where $c_t$ typically represents calibration parameters at time t $b_{t,k}$ all other state parameters in the time and/or space volume A state transition matrix (bock-diagonal) at time t B matrix (bock-diagonal) for state-independent effects $u_t$ at time t.

Consequently, two (or three) types of gigantic Regression Analysis problems $$z_t = Z_t s_t + e_t \quad (18)$$

were faced as follows:

Augmented model for a space volume case: see also equations (15) and (16), e.g. for the data of an entire windtracking experiment with K consecutive balloon positions:

$$\begin{bmatrix} y_{t,1} \\ A_1 \hat{b}_{t-1,1} + B_1 u_{b_{t-1,1}} \\ y_{t,2} \\ A_2 \hat{b}_{t-1,2} + B_2 u_{b_{t-1,2}} \\ \cdot \\ \cdot \\ \cdot \\ y_{t,K} \\ A_K \hat{b}_{t-1,K} + B_K u_{b_{t-1,K}} \\ A_c \hat{c}_{t-1} + B_c u_{c_{t-1}} \end{bmatrix} = \begin{bmatrix} X_{t,1} & & & & G_{t,1} \\ I & & & & \\ & X_{t,2} & & & G_{t,2} \\ & I & & & \\ & & \cdot & & \cdot \\ & & & X_{t,K} & G_{t,K} \\ & & & I & \\ & & & & I \end{bmatrix} \begin{bmatrix} b_{t,1} \\ b_{t,2} \\ \cdot \\ \cdot \\ b_{t,K} \\ c_t \end{bmatrix} + \begin{bmatrix} e_{t,1} \\ A_1(\hat{b}_{t-1,1} - b_{t-1,1}) - a_{b_{t,1}} \\ e_{t,2} \\ A_2(\hat{b}_{t-1,2} - b_{t-1,2}) - a_{b_{t,2}} \\ \cdot \\ \cdot \\ \cdot \\ e_{t,K} \\ A_K(\hat{b}_{t-1,K} - b_{t-1,K}) - a_{b_{t,K}} \\ A_c(\hat{c}_{t-1} - c_{t-1}) - a_{c_t} \end{bmatrix}$$

Augmented Model for a moving time volume (e.g. for "whitening" an observed "innovations" sequence of residuals $e_t$ over a moving sample of length L):

$$\begin{bmatrix} y_t \\ A\hat{s}_{t-1}+Bu_{t-1} \\ \hline y_{t-1} \\ A\hat{s}_{t-2}+Bu_{t-2} \\ \hline \vdots \\ \hline y_{t-L+1} \\ A\hat{s}_{t-L}+Bu_{t-L} \\ \hline A\hat{C}_{t-1}+Bu_{c_{t-1}} \end{bmatrix} = \begin{bmatrix} H_t & & & & F_t \\ I & & & & \\ \hline & H_{t-1} & & & F_{t-1} \\ & I & & & \\ \hline & & \ddots & & \vdots \\ \hline & & & H_{t-L+1} & F_{t-L+1} \\ & & & I & \\ \hline & & & & I \end{bmatrix} \begin{bmatrix} s_t \\ s_{t-1} \\ \vdots \\ s_{t-L+1} \\ C_t \end{bmatrix} + \begin{bmatrix} e_t \\ A(\hat{s}_{t-1}-s_{t-1})-a_t \\ \hline e_{t-1} \\ A(\hat{s}_{t-2}-s_{t-2})-a_{t-1} \\ \hline \vdots \\ \hline e_{t-L+1} \\ A(\hat{s}_{t-L}-s_{t-L})-a_{t-L+1} \\ \hline A(\hat{C}_{t-1}-C_{t-1})-a_{c_t} \end{bmatrix}$$

Please observe that the matrix formula may take a "nested" Block-Angular structure. Fast semi-analytical solutions based on Updating: $\hat{S}_t = \{Z'_t V_t^{-1} Z_t\}^{-1} Z'_t V_t^{-1} Z_t$ (19)

for all these three cases were published in PCT/FI90/00122 (Lange, 1990), WIPO, Geneva, Switzerland.

The Fast Kalman Filter (FKF™) formulae for the recursion step at any timepoint t were as follows:

$$\hat{s}_{t-l} = \{X'_{t-l}V_{t-l}^{-1}X_{t-l}\}^{-1}X'_{t-l}V^{-1}(y_{t-l} - G_{t-l}\hat{c}_t) \quad (20)$$

for $l = 0, 1, 2, \ldots, L-1$ $$\hat{c}_t = \left\{ \sum_{l=0}^{L} G'_{t-l}R_{t-l}G_{t-l} \right\}^{-1} \sum_{l=0}^{L} G'_{t-l}R_{t-l}y_{t-l}$$

where, for $l=0,1,2,\ldots, L-1$, $$R_{t-l} = V_{t-l}^{-1}\{I - X_{t-l}\{X'_{t-l}V_{t-l}^{-1}X_{t-l}\}^{-1}X'_{t-l}V_{t-l}^{-1}\}$$

$$V_{t-l} = \begin{bmatrix} Cov(e_{t-l}) & \\ & Cov\{A(\hat{s}_{t-l-1} - s_{t-l-1}) - a_{t-l}\} \end{bmatrix}$$

$$y_{t-l} = \begin{bmatrix} y_{t-l} \\ A\hat{s}_{t-l-1} + Bu_{t-l-1} \end{bmatrix}$$

$$X_{t-l} = \begin{bmatrix} H_{t-l} \\ I \end{bmatrix}$$

$$G_{t-l} = \begin{bmatrix} F_{t-l} \\ \end{bmatrix}$$

and, i.e. for l=L, $$R_{t-L} = V_{t-L}^{-1}$$

$$V_{t-L} = Cov\{A(\hat{C}_{t-1} - C_{t-1}) - a_{c_t}\}$$

$$y_{t-L} = A\hat{C}_{t-1} + Bu_{c_{t-1}}$$

$$G_{t-L} = I.$$

A major R & D project was initiated in 1988 which led to the start of cooperation between ECMWF and Meteo-France for the coding of a dynamical atmospheric model, an optimal interpolation, a variational data assimilation and a Kalman Filter (FK), all in the same framework. The project is called IFS (Integrated Forecasting System), see Jean-Noel Thepaut and Philippe Courtier ( 1991): "Four-dimensional variational data assimilation using the adjoint of a multilevel primitive-equation model", Quarterly Journal of the Royal Meteorological Society, Volume 117, pp. 1225–1254.

Similar Kalman Filter (FK) studies have recently been reported also by Roger Daley (1992): "The Lagged Innovation Covariance: A Performance Diagnostic for Atmospheric Data Assimilation", Monthly Weather Review of the American Meteorological Society, Vol. 120, pp. 178–196, and Stephen E. Cohn and David F. Parrish (1991): "The Behavior of Forecast Error Covariances for a Kalman Filter in Two Dimensions", Monthly Weather Review of the American Meteorological Society, Vol. 119, pp. 1757–1785. Unfortunately, the ideal Kalman Filter systems described in the above reports have been out of reach at the present time. Dr. T. Gal-Chen of School of Meteorology, University of Oklahoma, reported in May 1988: "There is hope that the developments of massively parallel super computers (e.g., 1000 desktop CRAYs working in tandem) could result in algorithms much closer to optimal ... ", see "Report of the Critical Review Panel—Lower Tropospheric Profiling Symposium: Needs and Technologies", Bulletin of the American Meteorological Society, Vol. 71, No. 5, May 1990, page 684.

There exists a need for exploiting the principles of the Fast Kalman Filtering (FKF™) method for a broad technical field (broader than just calibrating a sensor system in some narrow sense of word "calibration") with equal or better computational speed, reliability, accuracy, and cost benefits than other Kalman Filtering methods can do.

SUMMARY OF THE INVENTION

These needs are substantially met by provision of the generalized Fast Kalman Filtering (FKF™) method for calibrating and adjusting the sensors and various model parameters of a dynamical system in real-time or in near real-time as described in this specification. Through the use of this method, the computation results include the forecast error covariances that are absolute necessary for warning, decision making and control purposes.

BEST MODE FOR CARRYING OUT THE INVENTION

Figure 1:
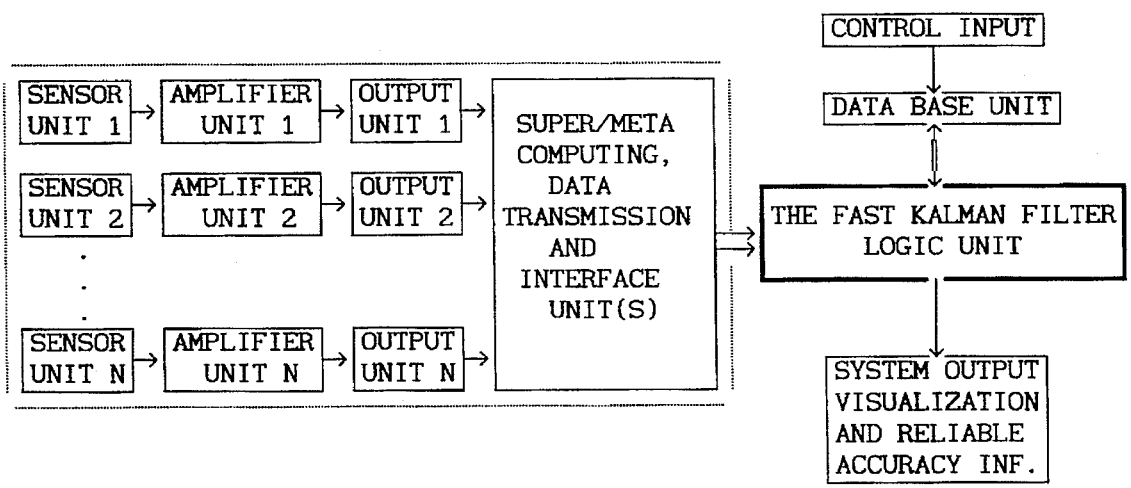
FIG. 1. Diagram of the disclosed invention.

Prior to explaining the invention, it will be helpful to first understand prior art Kalman Filter (FK) theory exploited in the current experimental Numerical Weather Prediction (NWP) systems. As previously, they make use of equation (1):

Measurement Equation: $y_t = H_t s_t + e_t$     (linearized regression)

where state vector $s_t$ describes the state of the atmosphere at timepoint t. Now, $s_t$ usually represents all gridpoint values of atmospheric variables e.g. the geopotential heights of a number of different pressure levels.

The dynamics of the atmosphere is governed by a well-known set of partial differential equations ("primitive" equations). Making use of the so-called adjoint operator of the model the following linear expression of equation (2) is obtained for the time evolution of the atmosphere at each time step:

State Equation: $s_t = As_{t-1} + Bu_{t-1} + a_t$ (the discretized dyn-stoch model)

The four-dimensional data assimilation results ($\hat{s}_t$) and the NWP forecasts ($\tilde{s}_t$), respectively, are obtained from the Kalman Filter system as follows:

$$\hat{s}_t = \tilde{s}_t + K_t(y_t - H_t \tilde{s}_t)$$

$$\tilde{s}_t = A\hat{s}_{t-1} + Bu_{t-1} \quad (21)$$

where $$P_t = Cov(\tilde{s}_t) = A\, Cov(\hat{s}_{t-1})A' + Q_t \quad \text{(prediction accuracy)}$$

$$Q_t = Cov(a_t) = Ea_t a'_t \quad \text{(system noise)}$$

$$R_t = Cov(e_t) = Ee_t e'_t \quad \text{(measurement noise)}$$

and the crucial Updating computations are based on the following Kalman Recursion:

$$K_t = P_t H'_t (H_t P_t H'_t + R_t)^{-1} \quad \text{(Kalman Gain matrix)}$$

$$Cov(\hat{s}_t) = P_t - K_t H_t P_t \quad \text{(estimation accuracy)}.$$

The matrix inversion needed here for the computation of the Kalman Gain matrix is exceedingly difficult for any realistic NWP system because the data assimilation system must be able to digest several ten thousand data elements at a time.

The method of the invention will now be described. We start with the Augmented Model from equation (13):

$$\begin{bmatrix} y_t \\ A\hat{s}_{t-1} + Bu_{t-1} \end{bmatrix} = \begin{bmatrix} H_t \\ I \end{bmatrix} s_t + \begin{bmatrix} e_t \\ A(\hat{s}_{t-1} - s_{t-1}) - a_t \end{bmatrix}$$

i.e. $\quad z_t \quad = \quad Z_t s_t \quad + \quad \epsilon_t$

For the four-dimensional data assimilation the following two equations are obtained for its Updating:

$$\hat{s}_t = (Z'_t V_t^{-1} Z_t)^{-1} Z'_t V_t^{-1} z_t \quad \ldots \text{(optimal estimation, by Gauss-Markov)} \quad (22)$$

$$= \{H'_t R_t^{-1} H_t + P_t^{-1}\}^{-1}(H'_t R_t^{-1} y_t + P_t^{-1} \tilde{s}_t)$$

or, $\quad = \tilde{s}_t + K_t(y_t - H_t \tilde{s}_t) \quad \ldots \text{(alternatively)}$ and, $$Cov(\hat{s}_t) = E(\hat{s}_t - s_t)(\hat{s}_t - s_t)' = (Z'_t V_t^{-1} Z_t)^{-1} \quad (23)$$

$$= \{H'_t R_t^{-1} H_t + P_t^{-1}\}^{-1} \quad \ldots \text{(estimation accuracy)}$$

where, as previously, $$\tilde{s}_t = A\hat{s}_{t-1} + Bu_{t-1} \quad \text{(NWP "forecasting")}$$

$$P_t = Cov(\tilde{s}_t) = A\, Cov(\hat{s}_{t-1})A' + Q_t \quad (24)$$

but instead of $$K_t = P_t H'_t (H_t P_t H'_t + R_t)^{-1} \quad \text{(Kalman Gain matrix)}$$

we take $$K_t = Cov(\hat{s}_t) H'_t R_t^{-1} \quad (25)$$

The Augmented Model approach is superior to the use of the Kalman Recursion formulae for a large vector of input data $y_t$ because the computation of the Kalman Gain matrix $K_t$ required a huge matrix inversion when $Cov(\hat{s}_t)$ was unknown. Both methods are algebraically and statistically equivalent but certainly not numerically.

Unfortunately, the Augmented Model formulae above may still become much too difficult to handle numerically if the number of the state parameters is overly large. This actually happens, firstly, if state vector $s_t$ consists of enough gridpoint data for a realistic representation of the atmosphere. A spectral decomposition (or empirical orthogonal functions) could be attempted here for the purpose of decreasing the number of state parameters. Secondly, there are many other state parameters that must be included in the state vector for a realistic NWP system. These are first of all related to systematic (calibration) errors of observing systems as well as to the so-called physical parameterization schemes of small scale atmospheric processes.

Fortunately, all these problems are overcome by using the method of decoupling states through exploitation of the general Fast Kalman Filtering (FKF™) method. For the large observing systems of the atmosphere their design matrices H typically are sparse. Thus, one can perform the following $$\text{Partitioning:} \quad s_t = \begin{bmatrix} b_{t,1} \\ \cdot \\ \cdot \\ \cdot \\ b_{t,K} \\ c_t \end{bmatrix} \quad y_t = \begin{bmatrix} y_{t,1} \\ y_{t,2} \\ \cdot \\ \cdot \\ \cdot \\ y_{t,K} \end{bmatrix} \quad (26)$$

$$H_t = \begin{bmatrix} X_{t,1} & & & & G_{t,1} \\ & X_{t,2} & & & G_{t,2} \\ & & \cdot & & \cdot \\ & & & \cdot & \cdot \\ & & & & X_{t,K} & G_{t,K} \end{bmatrix}$$

-continued $$A = \begin{bmatrix} A_1 \\ \cdot \\ \cdot \\ \cdot \\ A_K \\ A_c \end{bmatrix} \quad \text{and,} \quad B = \begin{bmatrix} B_1 \\ \cdot \\ \cdot \\ \cdot \\ B_K \\ B_c \end{bmatrix}$$

where
- $c_t$ typically represents "calibration" parameters at time t
- $b_{t,k}$ values of atmospheric parameters at grid point k (k=1, ... K)
- A state transition matrix at time t (submatrices $A_1, \ldots, A_K, A_c$)
- B for state-independent effects (submatrices $B_1, \ldots, B_K, B_c$).

Consequently, the following gigantic Regression Analysis problem is faced:

$$\begin{bmatrix} y_{t,1} \\ \overline{A_1\hat{s}_{t-1}+B_1u_{t-1}} \\ y_{t,2} \\ \overline{A_2\hat{s}_{t-1}+B_2u_{t-1}} \\ \vdots \\ y_{t,K} \\ \overline{A_K\hat{s}_{t-1}+B_Ku_{t-1}} \\ \overline{A_c\hat{s}_{t-1}+B_cu_{t-1}} \end{bmatrix} = \begin{bmatrix} X_{t,1} & & & & G_{t,1} \\ I & & & & \\ & X_{t,2} & & & G_{t,2} \\ & I & & & \\ & & \ddots & & \vdots \\ & & & X_{t,K} & G_{t,K} \\ & & & I & \\ & & & & I \end{bmatrix} \begin{bmatrix} b_{t,1} \\ b_{t,2} \\ \vdots \\ b_{t,K} \\ c_t \end{bmatrix} + \begin{bmatrix} e_{t,1} \\ \overline{A_1(\hat{s}_{t-1}-s_{t-1})-a_{b_{t,1}}} \\ e_{t,2} \\ \overline{A_2(\hat{s}_{t-1}-s_{t-1})-a_{b_{t,2}}} \\ \vdots \\ e_{t,K} \\ \overline{A_K(\hat{s}_{t-1}-s_{t-1})-a_{b_{t,K}}} \\ A_c(\hat{s}_{t-1}-s_{t-1})-a_{c_t} \end{bmatrix}$$

The Fast Kalman Filter (FKF™) fomulae for the recursion step at any timepoint t are as follows:

$$\hat{b}_{t,k} = \{X'_{t,k}V^{-1}_{t,k}X_{t,k}\}^{-1}X'_{t,k}V^{-1}(y_{t,k} - G_{t,k}\hat{c}_t) \quad (28)$$

for $k = 1, 2, \ldots, K$ $$\hat{c}_t = \left\{ \sum_{k=0}^{K} G'_{t,k}R_{t,k}G_{t,k} \right\}^{-1} \sum_{k=0}^{K} G'_{t,k}R_{t,k}y_{t,k}$$

where, for k=1,2, ... K, $$R_{t,k} = V^{-1}_{t,k}\{I - X_{t,k}\{X'_{t,k}V^{-1}_{t,k}X_{t,k}\}^{-1}X'_{t,k}V^{-1}_{t,k}\}$$

$$V_{t,k} = \begin{bmatrix} Cov(e_{t,k}) & \\ & Cov\{A_K(\hat{s}_{t-1}-s_{t-1}) - a_{b_{t,k}}\} \end{bmatrix}$$

$$y_{t,k} = \begin{bmatrix} y_{t,k} \\ A_k\hat{s}_{t-1} + B_ku_{t-1} \end{bmatrix}$$

$$X_{t,k} = \begin{bmatrix} X_{t,k} \\ \overline{I} \end{bmatrix}$$

$$G_{t,k} = \begin{bmatrix} G_{t,k} \\ \overline{\quad} \end{bmatrix}$$

and, i.e. for k=0, $$R_{t,0} = V_{t,0}^{-1}$$

$$V_{t,0} = Cov\{A_c(\hat{s}_{t-1}-s_{t-1}) - a_{c_t}\}$$

$$y_{t,0} = A_c\hat{s}_{t-1} + B_cu_{t-1}$$

$$G_{t,0} = I.$$

The data assimilation accuracies are obtained from equation (23) as follows:

$$Cov(\hat{s}_t) = Cov(\hat{b}_{t,1}, \ldots, \hat{b}_{t,K}, \hat{c}_t) \quad (29)$$

$$= \begin{vmatrix} C_1 + D_1SD'_1 & D_1SD'_2 & \cdots & D_1SD'_K & -D_1S \\ D_2SD'_1 & C_2 + D_2SD'_2 & \cdots & D_2SD'_K & -D_2S \\ \vdots & \vdots & & \vdots & \vdots \\ D_KSD'_1 & D_KSD'_2 & \cdots & C_K + D_KSD'_K & -D_KS \\ -SD'_1 & -SD'_2 & \cdots & -SD'_K & S \end{vmatrix}$$

where $$C_k = \{X'_{t,k}V^{-1}_{t,k}X_{t,k}\}^{-1} \quad \text{for } k = 1, 2, \ldots, K$$

$$D_k = \{X'_{t,k}V^{-1}_{t,k}X_{t,k}\}^{-1}X'_{t,k}V^{-1}G_{t,k} \quad \text{for } k = 1, 2, \ldots, K$$

$$S = \left\{ \sum_{k=0}^{K} G'_{t,k}R_{t,k}G_{t,k} \right\}^{-1}$$

Through these semi-analytical means all the matrices to be inverted for the solution of gigantic Regression Analysis models of type shown in equation (27) are kept reasonably small and, especially, for the preferred embodiment of the invention for an operational Numerical Weather Prediction (NWP) model and four-dimensional data assimilation system that is much too large to be specified here. Obviously, the error variances and covariances of the forecasts and the data assimilation results are derived using equations (24) and (29), respectively.

The generalized Fast Kalman Filtering (FKF™) formulae given in equations (28) and (29) are pursuant to the invented method.

Those stilled in the art will appreciate that many variations could be practiced with respect to the above described invention without departing from the spirit of the invention. Therefore, it should be understood that the scope of the invention should not be considered as limited to the specific embodiment described, except in so far as the claims may specifically include such limitations.

References (1) Kalman, R. E. (1960): "A new approach to linear filtering and prediction problems". Trans. ASME J. of Basic Eng. 82:35–45.

(2) Lange, A. A. (1982): "Multipath propagation of VLF Omega signals". IEEE PLANS '82—Position Location and Navigation Symposium Record, December 1982, 302–309.

(3) Lange, A. A. (1984): "Integration, calibration and intercomparison of windfinding devices". WMO Instruments and Observing Methods Report No. 15.

(4) Lange, A. A. (1988a): "A high-pass filter for optimum calibration of observing systems with applications". Simulation and Optimization of Large Systems, edited by A. J. Osiadacz, Oxford University Press/Clarendon Press, Oxford, 1988, 311–327.

(5) Lange. A. A. (1988b): "Determination of the radiosonde biases by using satellite radiance measurements". WMO Instruments and Observing Methods Report No. 33, 201–206.

(6) Lange, A. A. (1990): "Apparatus and method for calibrating a sensor system". International Application Published under the Patent Cooperation Treaty (PCT), World Intellectual Property Organization, International Bureau, WO 90/13794, PCT/FI90/00122, 15 Nov. 1990.

I claim:

1. A method for adjusting model and calibration parameters of a large sensor system accompanied with said model of external events by Kalman filtering, the sensor output units providing signals in response to said external events and where the number of simultaneously processed sensor output signal values is in excess of 50, the method comprising the steps of:

a) providing a data base unit for storing information on:
      a plurality of test point sensor output signal values for some of said sensors and a plurality of values for said external events corresponding to said test point sensor output signal values, simultaneous time series of said output signal values from adjacent sensors for comparison;

said sensor output signal values accompanied with values for said model and calibration parameters and values for said external events corresponding to a situation; and, controls of said sensors and changes in said external events corresponding to a new situation;

b) providing a logic unit for accessing said sensor signal output values with said model and calibration parameters, said logic unit having a two-way communications link to said data base unit, and computing initial values for unknown model and calibration parameters with accuracy estimates by using Lange's High-pass Filter as required;

c) providing said sensor output signal values from said sensors, as available, to said logic unit;

d) providing information on said controls and changes to said data base unit;

e) accessing current values of said model and calibration parameters and elements of a state transition matrix, and computing by using the Fast Kalman Filter (FKF) formulas obtained from Lange's sparse-matrix inversion formula, in said logic unit, updates of said model and calibration parameters, values of said external events and their accuracies corresponding to said new situation;

f) controlling stability of said Kalman filtering by monitoring said accuracy estimates, in said logic unit, and by indicating need for new test point data, comparisons or system reconfiguration;

g) adjusting those of said model and calibration parameter values for which stable updates are available.

* * * * *